(12) United States Patent
Hsieh

(10) Patent No.: US 6,352,818 B1
(45) Date of Patent: Mar. 5, 2002

(54) PHOTORESIST DEVELOPMENT METHOD EMPLOYING MULTIPLE PHOTORESIST DEVELOPER RINSE

(75) Inventor: Hung-Chang Hsieh, Hsin-Chu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/387,439

(22) Filed: Sep. 1, 1999

(51) Int. Cl.[7] ............................. G03F 7/30; G03F 7/32; G03C 5/16; B08B 3/04; B08B 3/08
(52) U.S. Cl. .................... 430/322; 430/326; 430/331; 134/1.3; 134/26; 134/29
(58) Field of Search .......................... 430/322, 326, 430/329, 331; 134/1.3, 26, 29

(56) References Cited

U.S. PATENT DOCUMENTS

| | | | |
|---|---|---|---|
| 4,873,177 A | * 10/1989 | Tanaka et al. | 430/326 |
| 5,037,506 A | 8/1991 | Gupta et al. | 156/646 |
| 5,262,283 A | 11/1993 | Sezi et al. | 430/375 |
| 5,429,910 A | 7/1995 | Hanawa | 430/313 |
| 5,763,016 A | 6/1998 | Levenson et al. | 427/510 |
| 6,103,445 A | * 8/2000 | Willson et al. | 430/270.1 |

* cited by examiner

Primary Examiner—Janet Baxter
Assistant Examiner—Sin J. Lee
(74) Attorney, Agent, or Firm—George O. Saile; Stephen B. Ackerman; Alek P. Szecsy

(57) ABSTRACT

A method for forming within a deep ultraviolet (DUV) sensitive photosensitive layer formed upon a substrate employed within a microelectronics fabrication a pattern with attenuated defects and improved strippability. There is provided a substrate employed within a microelectronics fabrication. There is then formed over the substrate a photosensitive layer formed of an organic polymer resin plus additives which is sensitive to deep ultraviolet (DUV) irradiation. There is then formed within the photosensitive layer a patterned latent image by selective irradiation with a deep ultraviolet (DUV) source. There is then developed the latent image by successive treatment of the photosensitive layer to a first developer agent at a first concentration and a second developer agent at a second concentration, interspersed with aqueous solvent rinses, to form a patterned photoresist layer with attenuated residues. The patterned photosensitive layer is then formed into a patterned photoresist mask layer by drying and hard baking, with attenuated defects and improved strippability.

1 Claim, 2 Drawing Sheets

PHOTORESIST DEVELOPMENT METHOD EMPLOYING MULTIPLE PHOTORESIST DEVELOPER RINSE

BACKGROUND OF THE INVENTION

1. Field of the Invention

The invention relates to the field of microelectronics fabrication. More particularly, the invention relates to the field of photoresist development during the course of microelectronics fabrication.

2. Description of the Related Art

Microelectronics devices are fabricated employing multiple layers of materials formed upon suitable carriers or substrates. Many of the layers of microelectronics materials must be patterned and registered accurately to fine dimensions. As circuit density and performance requirements have increased, the tolerances and dimensions of the patterns have become correspondingly smaller. It is common practice to form patterns in layers of microelectronics materials employing photolithography, wherein the layer of material to be patterned is coated with a light sensitive lacquer or photoresist material, which is then exposed to a pattern of light radiation to form the latent image of the pattern in the photoresist material. This latent image is then chemically developed to form a photoresist etch mask of the pattern, which can then be transferred to the underlying material layer by additive or subtractive processes such as etching or other analogous process.

The formation of increasingly finely dimensioned patterns has resulted in the need for increasingly shorter wavelength radiation to attenuate diffraction limits on the resolution of the image, and for photoresists which are capable of being exposed by such shorter wavelength radiation. Currently there is in use deep ultraviolet (DUV) radiation and excimer laser radiation which utilize photoresists sensitive to exposure to radiation of wavelengths down to about 248 nanometers (nm). The exposure of photoresist materials to such short wavelength, and hence energetic, radiation and the increasingly finely dimensioned patterns employed place stringent requirements on defect levels within the resist layers. It is necessary to minimize the amount of undeveloped material or residue left after developing the patterned photoresist layer. In the same vein, the need to remove the used photoresist layers completely without residues after processing the pattern is also a priority requirement.

Although satisfactory deep ultraviolet (DUV) photoresists are available in the form of organic linear polymers with substituent groups such as substituted phenols such as, for example, t-butoxycarbonyl (t-BOC) polymer resins formulated with photoactive materials, the use of such resists is not without problems. In many cases, it is desirable to employ photoresists which are positive with respect to image formation: i.e., such photoresists become more soluble to the developer where illuminated so that after exposure and development, the photoresist pattern is a positive image of the exposure photomask pattern. In the case of the t-BOC type resists, this is accomplished by formulating a light-absorbing additive with the resin which forms an acid upon irradiation. The acid reacts with the resin generally upon heating to split off the substituent groups and leave behind an alkali-soluble modified resin, which is then developed away by a suitable alkaline developing agent.

In such resists, any regions of exposed photoresist material which are not dissolve upon development remains in the exposed area of the pattern as a potential defect. When such residues are small with respect to typical image dimensions, they are not particularly troublesome. However, as the pattern dimensions become smaller than 0.25 micron, residues may become comparable to pattern dimensions and may be expected to adversely affect device manufacturing yields. Negative working photoresists, in which the exposed regions are rendered less soluble, also have the same potential difficulty with residues in the unexposed soluble portions of the photoresist image pattern.

It is therefore towards the goal of improved exposure and development methods for deep ultraviolet (DUV) photosensitive materials that the present invention is generally and specifically directed.

Various methods have been disclosed for improved deep ultraviolet (DUV) photoresist exposure, development and stripping.

For example, Gupta et al., in U.S. Pat. No. 5,037,506, disclose a method for improved stripping of deep UV and ion implant hardened photoresists. The method employs exposure of the hardened resist layer to anhydrous gaseous sulfur trioxide, followed by treatment in solvents such as water, alkonols, ketones and mixtures thereof.

Further, Sezi et al., in U.S. Pat. No. 5,262,283, disclose a method for forming high resolution patterns with steep edges in photoresist in the deep UV range. The method employs a resin and photoactive compound which, after exposure and treatment with an aqueous or alcohol-based solution of a polyfunctional amino- or hydroxy-silane, is then etched in an oxygen plasma to form the pattern.

Still further, Hanawa, in U.S. Pat. No. 5,429,910, discloses a method for forming an accurate vertical edged profile pattern in a conventional chemical amplification positive resist exposed with deep UV radiation. The method employs acid treatment of an exposed chemical amplification positive photoresist layer, followed by baking and subsequent development of the photoresist pattern.

Finally, Levenson et al., in U.S. Pat. No. 5,763,016, disclose a method for developing patterns in exposed photoresists either by use of a gaseous agent to accelerate the wet chemical development of the pattern or by direct development as a dry developing agent. The method employs anhydrous sulfur trioxide gas to react with an organic coating having a previously formed surface pattern or latent image pattern to render the pattern developable, either by means of wet chemical development which discriminates between patterned and unpatterned regions, or by direct removal of previously formed regions.

Desirable within the art of microelectronics fabrications are additional methods for forming and stripping deep ultraviolet (DUV) photoresist patterned layers.

It is towards this goal that the present invention is generally and more specifically directed.

SUMMARY OF THE INVENTION

It is a first object of the present invention to provide a method for forming a pattern within a photosensitive layer formed upon a substrate employed within a microelectronics fabrication with attenuated defects.

It is a second object of the present invention to provide a method in accord with the first object of the present invention, where there is enhanced the development of patterned images in photosensitive layers exposed to deep ultraviolet (DUV) irradiation, with attenuated residues within the patterned photoresist mask layer and improved subsequent stripping thereof.

It is a third object of the present invention to provide a method in accord with the first object of the present invention and the second object of the present invention, where the method is readily commercially implemented.

In accord with the objects of the present invention, there is provided a method for forming a pattern within a deep ultraviolet (DUV) photosensitive layer employed in microelectronics fabrications with attenuated defeats and improved stripping. To practice the invention, there is first provided a substrate employed within a microelectronics fabrication. Formed over the substrate is a deep ultraviolet (DUV) photosensitive layer. After selective deep ultraviolet (DUV) exposure of the photosensitive layer to form a latent image therein, there is then performed a post exposure bake of the photosensitive layer. Development of the latent image pattern is then performed employing treatment of the photosensitive layer with a first developer agent. Then a second developer treatment employing a dilute solution of the first developer agent is followed by a water solvent rinse to produce attenuated residues in the developed pattern. After drying and hard baking, the developed patterned photoresist mask layer may be employed in a microelectronics fabrication process with attenuated defects and thereafter may be easily stripped.

The present invention may be practiced where the microelectronics fabrication is selected from the group including but not limited to integrated circuit microelectronics fabrications, solar cell microelectronics fabrications, charge coupled device microelectronics fabrications and flat panel display microelectronics fabrications.

The present invention employs materials and methods as are known in the art of microelectronics fabrications, but in a novel order, sequence and arrangement. Therefore the present invention is readily commercially implemented.

BRIEF DESCRIPTION OF THE DRAWINGS

The objects, features and advantages of the present invention are understood within the context of the Description of the Preferred Embodiment as set forth below. The Description of the Preferred Embodiment is understood within the context of the accompanying drawings, which form a material part of this disclosure, wherein.

DESCRIPTION OF THE PREFERRED EMBODIMENT

The present invention provides a method for forming within a deep ultraviolet (DUV) photosensitive layer formed upon a substrate employed within a microelectronics fabrication a patterned photoresist mask layer with attenuated defeats and improved strippability.

Figure 1:
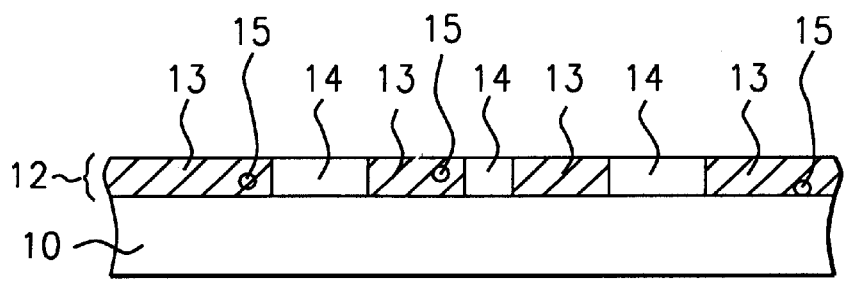
FIGS. 1, 2, 3, 4 and 5 are directed towards a general embodiment of the present invention. Shown in FIGS. 1 to 5 are a series of schematic cross-sectional diagrams illustrating the results of formation of a pattern in a deep ultraviolet (DUV) photoresist layer with attenuated defects upon a substrate employed within a microelectronics fabrication in accord with the present invention.

Referring now to FIGS. 1 to 5, there is shown a series of schematic cross-sectional drawings illustrating the formation of a patterned photosensitive layer upon a substrate in accord with a general embodiment of the present invention. FIG. 1 is a schematic cross-sectional diagram of a microelectronics fabrication at an early stage in its fabrication in accord with the present invention.

Shown in FIG. 1 is a substrate 10 upon which is formed a photosensitive layer 12. The photosensitive layer 12 has been selectively illuminated by deep ultraviolet (DUV) radiation to form exposed areas 13 and unexposed areas 14. Found within exposed areas are residues 15 which are regions of material which may be less completely chemically altered by the illumination than is the surrounding photosensitive material.

With respect to the substrate 10 shown in FIG. 1, the substrate 10 may be the substrate itself employed within a microelectronics fabrication, or alternatively the substrate may be any of several layers of microelectronics materials formed upon a substrate employed within a microelectronics fabrication. The substrate may be formed of materials including microelectronics conductor materials, microelectronics semiconductor materials and microelectronics dielectric materials.

With respect to the photosensitive layer 12 shown in FIG. 1, the photosensitive layer 12 is formed employing an organic polymer resin with photoactive components and acid forming components formulated to produce a positive acting photoresist layer which will become more soluble upon exposure to deep ultraviolet radiation. Preferably, the organic polymer resin is polyhydroxystyrene (PHS), and the photoactive compound and acid forming components are polyacrylate and polynorbornene.

With respect to the exposed regions 13 and unexposed regions 14, the patterned exposed regions and unexposed regions are formed by selective illumination of the photosensitive layer by a deep ultraviolet (DUV) source employing a photomask or reticle to form the image pattern. Preferably the DUV source is an excimer chemical laser employing argon fluoride (ArF), krypton fluoride (KrF), or fluorine ($F_2$).

With respect to the incompletely soluble residues 15 shown in FIG. 1, the incompletely soluble residues 15 are generally small regions of organic polymer resin and other components of the photosensitive layer which are less soluble in the developer than the bulk of the exposed photoresist for a variety of reasons. Without wishing to be bound by speculation, it is thought that such regions may have become gelatinous or "gelled" due to a greater degree of polymerization, and are no longer capable of being completely transformed by illumination so as to be soluble in the developing agent. Such gel particles are variable in size and may be comparable to the dimensions of the pattern desired in the photosensitive layer.

Figure 2:
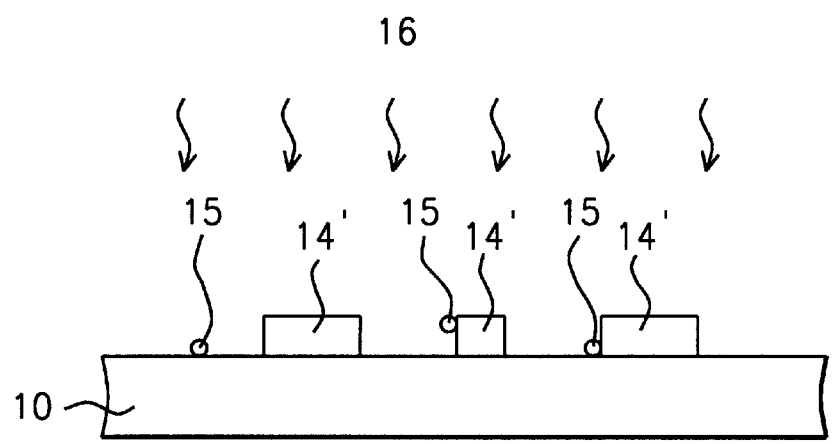

Referring now more particularly to FIG. 2, there is shown a schematic cross-sectional diagram illustrating the results of further processing of the microelectronics fabrication whose schematic cross-sectional diagram is shown in FIG. 1 in accord with the general embodiment of the present invention. Shown in FIG. 2 is a microelectronics fabrication otherwise equivalent to the microelectronics fabrication shown in FIG. 1, but where there has been treated the substrate with a developing agent 16 followed by a water rinse to selectively dissolve the exposed regions of the photosensitive layer and leave behind the positive pattern 14' of the exposure image, as well as insoluble gel particles, upon the substrate.

With respect to the developing agent 16 shown in FIG. 2, the developing agent 16 is an aqueous solution of tetra methyl ammonium hydroxide (TMAH). Preferably the concentration of TMAH in the developer is 2.38% by weight in $H_2O$, with the developer temperature of from about 20 to about 25 degrees centigrade.

Figure 3:
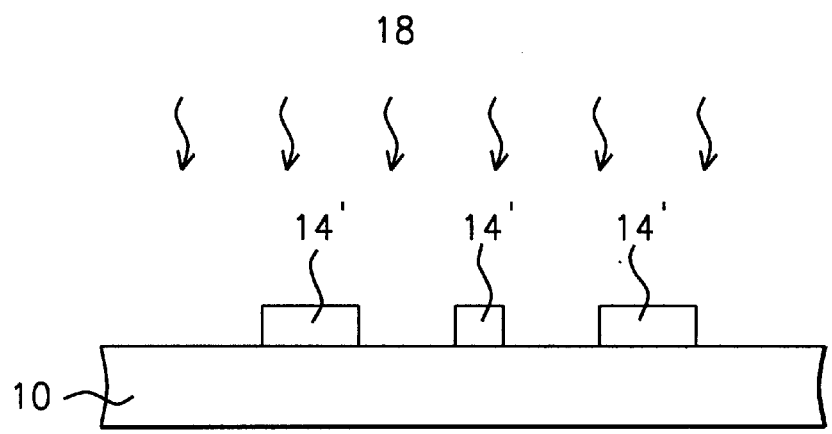

Referring now more particularly to FIG. 3, there is shown a schematic cross-sectional diagram illustrating the results of further processing of the microelectronics fabrication whose schematic cross-sectional diagram is shown in FIG. 2 in accord with a general embodiment of the present invention. Shown in FIG. 3 is a microelectronics fabrication otherwise equivalent to the microelectronics fabrication shown in FIG. 2, but where there has been treated the substrate to a second development step 18 followed by a water rinse to remove residues.

With respect to the second development treatment 18 shown in FIG. 3, the second development treatment employs a more dilute solution of TMAH. Preferably the second developer concentration is from about 0.05% to about 0.2% by weight in $H_2O$, with a surfactant of EO/PE copolymer at a concentration of about 0.05% by weight, employed at a temperature of about 23 degrees centigrade.

Figure 4:
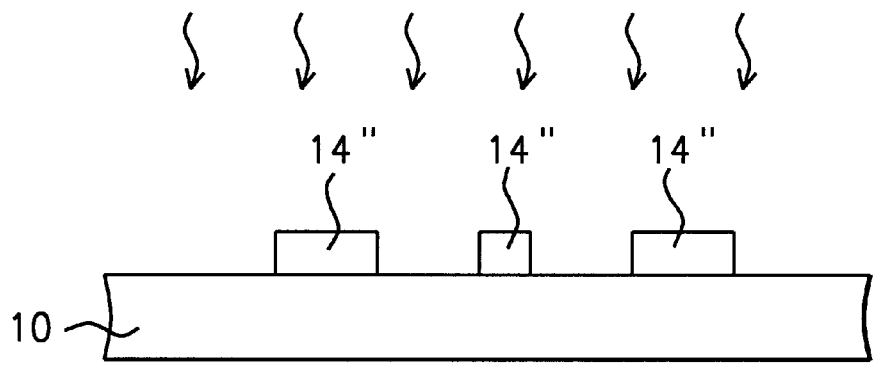

Referring now more particularly to FIG. 4, there is shown a schematic cross-sectional diagram illustrating the results of further processing of the microelectronics fabrication whose schematic cross-sectional diagram is shown in FIG. 3 in accord with a general embodiment of the present invention. Shown in FIG. 4 is a microelectronics fabrication otherwise equivalent to the microelectronics fabrication shown in FIG. 3, but where there has been dried and hard-baked 20 the substrate to form a patterned photoresist mask layer 14" with attenuated defects upon the substrate.

With respect to the dried and hard-baked photoresist mask pattern 14", the photoresist mask pattern 14" has been dried at a temperature of about 120 degrees centigrade, and then hard-baked preferably at a temperature of about 120 degrees centigrade for a period of time of from about 1 to about 3 minutes.

Figure 5:
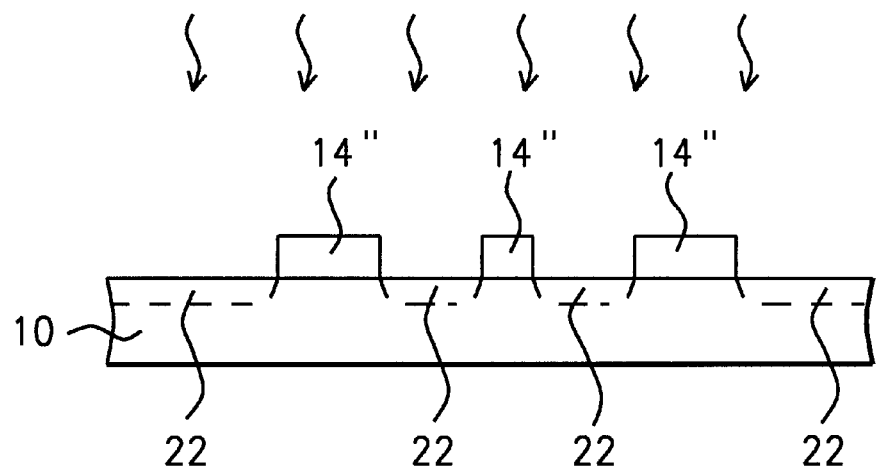

Referring now more particularly to FIG. 5, there is shown a schematic cross-sectional drawing illustrating the final results of processing the microelectronics fabrication whose schematic cross-sectional diagram is shown in FIG. 4 in accord with the general embodiment of the present invention. Shown in FIG. 5 is a microelectronics fabrication otherwise equivalent to the microelectronics fabrication shown in FIG. 4, but where there has been employed the patterned hard-baked photoresist layer with attenuated defects as a mask layer to form a patterned ion implanted region 22 by an ion implantation process 24, followed by stripping of the patterned photoresist mask layer 14".

With respect to the patterned ion implanted region 22 shown in FIG. 5, the patterned ion implanted region is formed employing an ion implantation method 24 as is well known in the art of microelectronics fabrication.

The present invention provides a method for forming a pattern within a photosensitive layer formed upon a substrate employed within a microelectronics fabrication employing selective deep ultraviolet (DUV) irradiation, with attenuated defects from residues after pattern development and with improved strippability.

The present invention does not employ treatment of the photoresist layer with any acid agents before, during or after the developer and solvent treatments, since there is no indication that nay such acid treatment is beneficial in reducing residues after pattern development. The present invention is focused upon the removal of residues and/or gel particles employing sequential treatment only with alkaline ammoniacal developer agents at various dilutions, and with aqueous rinses.

EXAMPLE

The advantages and benefits of the present invention are best realized by employment of specific processes which embody the general principles of the present invention. One specific example is given to illustrate the general method of the present invention is specific terms. The photosensitive layer employed is formed from polyhydroxystyrene (PHS) resin, polyacrylate and polynorbornene upon a silicon wafer of 200 millimeter diameter:

(1) Exposure: energy of between 20 and 100 mJ employing commercial equipment such as ASM PAS 3500/500, 700, and 300;

(2) Post exposure bake: temperature of from 100 to 120 degrees for about 60 seconds to about 180 seconds, cooling to room temperature of 22 degrees centigrade in about 30 to about 60 seconds;

(3) First developer: tetramethyl ammonium hydroxide (TMAH) 2.38% by weight in $H_2O$;

(4) First developer dispense: about 20 to about 100 cubic centimeters (cc) in 0.5 to 10 seconds;

(5) Develop (puddle): about 60 seconds to about 120 seconds followed by DI $H_2O$ solvent rinse on spinning wafer for about 30 to about 120 seconds;

(6) Second developer: tetramethyl ammonium hydroxide (TMAH) (0.2% by weight) and surfactant EO/PE copolymer (about 0.05 to about 0.2% by weight) in $H_2O$;

(7) Second developer treatment: (dispense): about 0.1 to 1.0 second while spinning wafer, followed by DI $H_2O$ solvent rinse from about 30 to about 120 seconds while spinning wafer;

(8) Dry: Spin wafer for about 60 to about 180 seconds at a spin speed of 4000 revolutions per minute (rpm);

(9) Hard Bake: hot plate at about 100 to about 120 degrees centigrade for about 60 to about 180 seconds.

The employment of the specific method above to embody the present invention results in a patterned photoresist mask layer upon the silicon substrate with a gel particle count of less than 10 compared with a particle count of 5000 for control samples without the dual developer and aqueous solvent treatment.

Other resins may be employed to similar effect to formulate deep ultraviolet (DUV) sensitive photosensitive materials in addition to typical t-BOC resins such as, for example, poly (4-tert-butoxycarbonyl oxystyrene). Additional examples are acetal-substituted linear organic polymer such as p-(1-ethoxy ethoxy) styrene/p-hydroxystyrene, and a copolymer of t-butyl methacrylate and p-hydroxystyrene (ESCAP) with appropriate light absorbing and acid forming components.

As is understood by a person skilled in the art, the preferred embodiment of the present invention is illustrative of the invention rather than limiting of the present invention. Revisions and modifications may be made to materials, structures and dimensions through which is provided the preferred embodiment of the present invention while still providing embodiments of the present invention which are within the spirit and scope of the present invention, as defined by the appended claims.

What is claimed is:

1. A method for forming within a photosensitive layer formed upon a substrate employed within microelectronics fabrication a pattern comprising:

providing a substrate employed within a microelectronics fabrication selected from the group consisting of integrated circuit microelectronics fabrications, charge coupled device microelectronics fabrications, solar cell microelectronics fabrications, ceramic substrate microelectronics fabrications, optoelectronics device microelectronics fabrications and flat panel display microelectronics fabrications;

forming upon the substrate a photosensitive layer sensitive to exposure to deep ultraviolet (DUV) radiation;

exposing the photosensitive layer selectively to radiation employing an excimer laser to form a latent image;

developing the latent image into a pattern by treatment in a first developing step with an aqueous solution of tetramethyl ammonium hydroxide (TMAH) at a concentration of about 2.38% by weight;

rinsing the developed pattern with a de-ionized water solvent;

further developing the developed pattern in a second developing step employing a diluted aqueous solution of tetramethyl ammonium hydroxide (TMAH) at a concentration of from about 0.05% to about 0.02% by weight; and rinsing the developed pattern with a de-ionized water solvent to attenuate residues within the developed pattern wherein the photoresist layer is not treated with any acid treatment before, during or after the developer and solvent treatments.

* * * * *